(12) United States Patent
Yanase

(10) Patent No.: US 11,199,768 B2
(45) Date of Patent: Dec. 14, 2021

(54) PELLICLE FRAME AND PELLICLE

(71) Applicant: Shin-Etsu Chemical Co., Ltd., Tokyo (JP)

(72) Inventor: Yu Yanase, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/999,439

(22) Filed: Aug. 21, 2020

(65) Prior Publication Data

US 2020/0379341 A1    Dec. 3, 2020

Related U.S. Application Data

(63) Continuation of application No. 16/127,599, filed on Sep. 11, 2018, now Pat. No. 10,859,909.

(30) Foreign Application Priority Data

Oct. 10, 2017   (JP) .............................. JP2017-197004

(51) Int. Cl.
*G03F 1/64* (2012.01)

(52) U.S. Cl.
CPC ..................................... *G03F 1/64* (2013.01)

(58) Field of Classification Search
CPC ..................................... G03F 1/62; G03F 1/64
USPC .......................................................... 430/5
See application file for complete search history.

(56) References Cited

U.S. PATENT DOCUMENTS

| | | | |
|---|---|---|---|
| 4,657,805 A | 4/1987 | Fukumitsu et al. | |
| 4,861,402 A | 8/1989 | Gordon | |
| 4,878,973 A | 11/1989 | Ohtake et al. | |
| 6,101,237 A | 8/2000 | Miyachi et al. | |
| 2006/0246234 A1 | 11/2006 | Meyers et al. | |
| 2009/0023082 A1 | 1/2009 | Shirasaki | |
| 2016/0291460 A1 | 10/2016 | Shirasaki | |
| 2016/0299421 A1 | 10/2016 | Horikoshi | |

FOREIGN PATENT DOCUMENTS

| | | | |
|---|---|---|---|
| JP | 58-219023 A | 12/1983 | |
| JP | 63-27707 B2 | 6/1988 | |
| JP | 10-70066 A | 3/1998 | |
| JP | 2002-40629 A | 2/2002 | |
| JP | 2009-25559 A | 2/2009 | |
| JP | 2015-18228 A | 1/2015 | |
| JP | 2016-130789 A | 7/2016 | |
| JP | 2016-191902 A | 11/2016 | |
| JP | 2016-200616 A | 12/2016 | |

OTHER PUBLICATIONS

Anonymous, "Properties: Titanium Alloys=Ti6Al4V Grade 5," retrieved from URL: https://web.archive.org/web/20170723124820/http://www.azom.com/properties.aspx?ArticleID=1547, Jul. 23, 2017, 6 pages.

Extended European Search Report for European Application No. 18196522.9, dated Feb. 26, 2019.

Japanese Decision of Refusal for Japanese Application No. 2017-197004, dated Mar. 23, 2021, with an English translation.

*Primary Examiner* — Christopher G Young

(74) *Attorney, Agent, or Firm* — Birch, Stewart, Kolasch & Birch, LLP

(57) ABSTRACT

The present invention is to provide a pellicle frame characterized by including a metal or alloy having a linear expansion coefficient of $10\times10^{-6}$ (1/K) or less and further a density of 4.6 g/cm$^3$ or less, and a pellicle characterized by including the pellicle frame as an element.

18 Claims, 2 Drawing Sheets

PELLICLE FRAME AND PELLICLE

CROSS-REFERENCE TO RELATED APPLICATION

This application is a Continuation application of application Ser. No. 16/127,599, filed on Sep. 11, 2018, which claims the benefit under 35 U.S.C. § 119(a) to Patent Application No. 2017-197004, filed in Japan on Oct. 10, 2017, all of which are hereby expressly incorporated by reference into the present application.

TECHNICAL FIELD

The present invention relates to a pellicle for lithography used as a dust guard when a semiconductor device such as large scale integration (LSI) and very large scale integration (VLSI), a printed board, a liquid crystal display, or the like is produced.

BACKGROUND ART

When a semiconductor device such as LSI and VLSI, a liquid crystal display, or the like is produced, a pattern is formed by irradiating a semiconductor wafer or an original plate for liquid crystal with light, and if dust adheres to a photomask or a reticle (hereinafter, simply referred to as a "photomask"), which is to be used at this time, the edge of the pattern becomes rough, and further there is a problem that the dimension, the quality, the appearance, or the like is impaired, for example, the base becomes black and dirty.

For this reason, the pattern formation work is usually performed in a clean room, however, it is still difficult to keep the photomask clean. Therefore, exposure is performed after attaching a pellicle as a dust guard onto a surface of the photomask. In this case, foreign matters do not adhere directly onto a surface of the photomask but adhere onto the pellicle film, therefore, if the focal point is set on a pattern of the photomask at the time of lithography, the foreign matters on the pellicle film become irrelevant to the transfer.

In general, a pellicle is obtained as follows: a good solvent for a pellicle film is applied onto an upper end surface of a pellicle frame made of aluminum, stainless steel, polyethylene or the like, and then air dried, and a transparent pellicle film made of nitrocellulose, cellulose acetate, a fluorine resin or the like, which well transmits light, is bonded onto the upper end surface (see Patent Document 1), or the pellicle film is bonded onto the upper end surface by an adhesive agent of an acrylic resin, an epoxy resin or the like (see Patent Documents 2 and 3). In addition, on a lower end of the pellicle frame, a pressure-sensitive adhesive layer for the attachment onto a photomask, which is made of a polybutene resin, a polyvinyl acetate resin, an acrylic resin, a silicone resin or the like, and a release layer (separator) for the purpose of protecting the pressure-sensitive adhesive layer, are arranged.

Further, in a case where such a pellicle is attached onto a surface of a photomask, and a photoresist film formed on a semiconductor wafer or an original plate for liquid crystal is exposed through the photomask, foreign matters such as dust adhere onto a surface of the pellicle and do not adhere directly onto a surface of the photomask, therefore, the influence of the foreign matters such as dust can be avoided by performing the irradiation with light for exposure so that the focal point is located on a pattern formed on the photomask.

By the way, in recent years, a semiconductor device and a liquid crystal display have been increasingly highly integrated and miniaturized actually. At present, a technique for forming a fine pattern of around 32 nm on a photoresist film is being put into practical use. As long as the pattern is around 32 nm, a space between a semiconductor wafer or an original plate for liquid crystal and a projection lens is filled with a liquid such as ultrapure water, and by using an argon fluoride (ArF) excimer laser, the pattern can be realized by an immersion exposure technique for exposing a photoresist film, or an improved technique using a conventional excimer laser, such as double exposure.

However, for a next-generation semiconductor device or liquid crystal display, further miniaturized pattern formation of 10 nm or less is required, and it is no longer possible to form such a miniaturized pattern of 10 nm or less by the improvement of a conventional exposure technique using an excimer laser.

Therefore, as a method for forming a pattern of 10 nm or less, an extreme ultra violet (EUV) exposure technique using EUV light having a main wavelength of 13.5 nm is promising. In a case where a fine pattern of 10 nm or less is formed on a photoresist film by using the EUV exposure technique, it is required to solve technical problems such as: what type of light source is used, what type of photoresist is used, and what type of pellicle is used. Among these technical problems, as to a new light source and a new photoresist material, the development has progressed and various proposals have been made.

With respect to a pellicle that affect the yield of a semiconductor device or a liquid crystal display, for example, in Patent Document 3, a silicon film having a thickness of 0.1 to 2.0 μm that is transparent and does not cause optical distortion is described as a pellicle film to be used for EUV lithography, however, in order to apply in practice, unresolved problems still remain and are a major obstacle to putting the EUV exposure technique into practical use in actuality.

Conventionally, as the material for a pellicle frame constituting a pellicle, in the exposure using an i-line (having a wavelength of 365 nm), a krypton fluoride (KrF) excimer laser light (having a wavelength of 248 nm), an argon fluoride (ArF) excimer laser light (having a wavelength of 193 nm), usually aluminum, stainless steel, polyethylene or the like is used, which are selected by taking only the rigidity and the processability into consideration.

On the other hand, as the material for a photomask, quartz glass is usually used in many cases. Further, as the pellicle film, if it is for an i-line, for KrF, or for ArF, nitrocellulose, cellulose acetate, a fluorine resin or the like is used, and if it is for EUV, a transparent film corresponding to a light source, such as silicon, is used.

However, in a case where a fine pattern of 10 nm or less is formed on a photoresist film by using the EUV exposure technique, when a conventional pellicle is used, wrinkles may be formed in the pellicle film, or the pellicle film may come off from a frame for a pellicle or may be torn or broken.

In Patent Document 4, it has been found that the wrinkle generation and breakage of the pellicle film are caused by expansion and contraction, and distortion of a pellicle frame, which can be caused by a temperature rise due to the light energy at the time of exposure, and it has been proposed that a material having a linear expansion coefficient of $10 \times 10^{-6}$ (1/K) or less is used for the frame.

However, a material such as Si, $SiO_2$, SiC or SiN, which has a low thermal expansion coefficient, is brittle, therefore, there is a problem of difficulty in the processing. In particular, for an EUV pellicle, since the pellicle arrangement space in an EUV exposure device is small, the height of the pellicle is required to be 2.5 mm or less.

Further, in general, on a side face of a pellicle frame of a pellicle, a jig hole used for handling or peeling off the pellicle from a photomask, and a ventilation part for reducing the pressure difference between the inside and outside of the pellicle are provided. In addition, in EUV lithography, in order to make the inside of an exposure device vacuum, a pellicle for EUV is required to withstand the pressure changes from the atmospheric pressure to the vacuum, and a ventilation part of the EUV pellicle is required to have a large area.

For example, the thickness of a pellicle frame for an EUV pellicle is smaller than 2.5 mm, however, in a case where a hole having a diameter of 1 mm is provided on a side face of a pellicle frame made of a material such as Si, $SiO_2$, SiC or SiN, the thickness in the vicinity of the hole of the pellicle frame may become small, and there is a high possibility that the pellicle frame is broken during the processing of a hole or during the peeling of a pellicle. If it is required to increase the area of the ventilation part, the possibility of breakage is further increased.

Therefore, it can also be considered that a metal such as invar is used as a material having a low thermal expansion coefficient. A metal and an alloy are easy to process, and are not broken even if a hole is provided on a side face of a pellicle frame.

By the way, the width of a pellicle frame is preferably as small as possible in order to widen the exposure area, and the width has been around 2 mm from the past. However, it has been found that in a case of an EUV pellicle, the width of a pellicle frame is limited by a pellicle film, and it is required to set the width as large as around 3 to 4 mm.

Further, in recent years, for the purpose of improving the throughput of EUV production, faster movement of a mask stage is required, and the total weight of a pellicle is required to be 15 g or less.

However, in a case where the width is changed from 2 mm to 4 mm, the volume of the pellicle frame is around twice, and even in a case where the width is 3 mm, the volume is around 1.5 times. Subsequently, it was found that the weight of a pellicle frame prepared by invar becomes extremely high.

CITATION LIST

Patent Document 1: JP-A S58-219023
Patent Document 2: U.S. Pat. No. 4,861,402
Patent Document 3: JP-B S63-27707
Patent Document 4: JP-A 2016-200616

SUMMARY OF THE INVENTION

The present invention has been made in view of such circumstances, and an object of the present invention to provide: a pellicle frame with which in a case where a fine pattern of 10 nm or less is formed on a photoresist film by using an EUV exposure technique, a situation in which wrinkles may be formed in a pellicle film, or the pellicle film may come off from a pellicle frame or may be torn or broken can be effectively prevented, and further the weight is low and the risk of breakage is low; and a pellicle using the pellicle frame.

The present inventors have found that by using a metal or alloy having a linear expansion coefficient of $10 \times 10^{-6}$ (1/K) or less and further a density of 4.6 $g/cm^3$ or less for a pellicle frame in a frame shape having an upper end face on which a pellicle film is to be arranged and a lower end face to face a photomask, the pellicle frame is most suitable for the latest EUV exposure technique because wrinkles or breakage is not generated in a pellicle film and the weight is low, and thus have completed the present invention.

Therefore, the present invention provides the following pellicle frame and pellicle.
1. A pellicle frame, including: a metal or alloy having a linear expansion coefficient of $10 \times 10^{-6}$ (1/K) or less and a density of 4.6 $g/cm^3$ or less.
2. The pellicle frame according to 1, wherein the metal or alloy is titanium or a titanium alloy.
3. The pellicle frame according to 1, wherein the pellicle frame has a thickness of less than 2.5 mm.
4. The pellicle frame according to 1, wherein one or a plurality of holes is provided on a side face.
5. A pellicle, including: the pellicle frame according to 1 as an element.

Advantageous Effects of the Invention

According to the pellicle frame and pellicle of the present invention, even if the temperature of a pellicle frame is increased by the light energy due to exposure, expansion and contraction, and distortion of the pellicle frame can be suppressed to be lower, and wrinkles or breakage is not generated in a pellicle film. In addition, since the pellicle frame and pellicle according to the present invention is excellent in the processability, the improvement of the yield is expected, and the area of a ventilation part can be set larger, and further, the pellicle frame and pellicle have little risk of breakage during pellicle peeling or the like, and are lightweight, therefore, the pellicle frame and pellicle can be applied to the latest EUV exposure technique.

BRIEF DESCRIPTION OF THE DRAWINGS

FIG. 1A is a view as viewed from a lower end face side, FIG. 1B is a view as viewed from an outer face side of the long side, and FIG. 1C is a view as viewed from an outer face side of the short side; FIG. 2A is a view as viewed from a lower end face side, FIG. 2B is a view as viewed from an outer face side of the long side, and FIG. 2C is a view as viewed from an outer face side of the short side.

DESCRIPTION OF THE PREFERRED EMBODIMENT

Figure 1A:
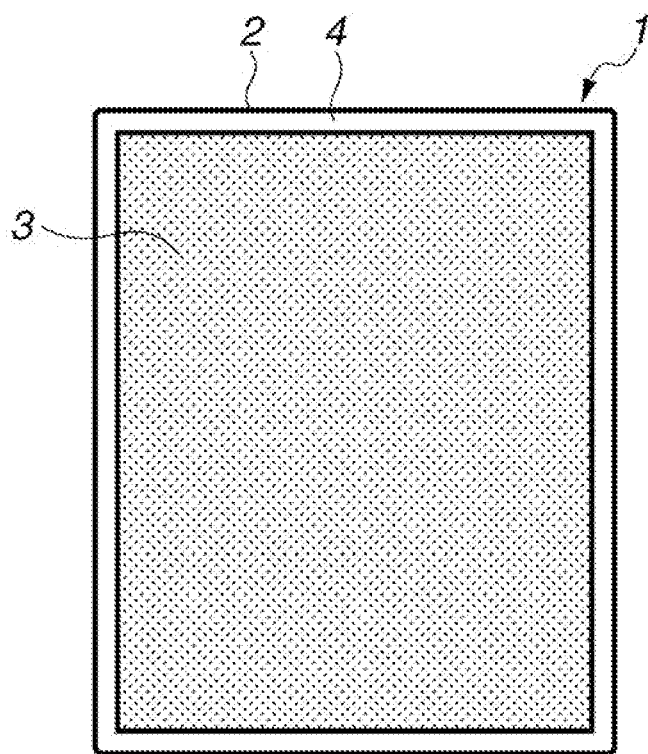
FIGS. 1A to 1C are schematic views (Example) showing one embodiment of a pellicle frame according to the present invention.

The pellicle frame according to the present invention usually has an upper end face on which a pellicle film is to be arranged and a lower end face to face a photomask. Further, the shape of the pellicle frame is a frame shape corresponding to the shape of a photomask onto which a pellicle is to be attached. In general, the shape of the pellicle frame is a quadrilateral (rectangular or square) frame shape.

The pellicle frame has an upper end face on which a pellicle film is to be arranged and a lower end face to face a photomask when the pellicle frame is attached onto a photomask. In general, on the upper end face, a pellicle film is arranged with an adhesive agent or the like therebetween, and on the lower end face, a pressure-sensitive adhesive or the like for attaching a pellicle onto a photomask is provided, but cases of the present invention are not limited to the above.

The size of a pellicle frame is not particularly limited, however, since the height of a pellicle for EUV is limited to 2.5 mm or less, the thickness of a pellicle frame for EUV is smaller than the height and is less than 2.5 mm. Actually, the thickness of the pellicle frame is preferably 2.0 mm or less and more preferably 1.6 mm or less in consideration of the thickness of a pellicle film, a mask pressure-sensitive adhesive and the like.

Further, in order to sufficiently exhibit a function as a pellicle, the pellicle frame is required to have a height of 1.5 mm or more. In this regard, the thickness of a pellicle frame for EUV is preferably 1.0 mm or more in consideration of the thickness of a pellicle film, a mask pressure-sensitive adhesive and the like.

In addition, usually, on a side face of a pellicle frame, a jig hole used for handling or peeling off the pellicle from a photomask, and a ventilation part for reducing the pressure difference between the inside and outside of the pellicle are provided. Further, in EUV lithography, in order to make the inside of an exposure device vacuum, a pellicle for EUV is required to withstand the pressure changes from the atmospheric pressure to the vacuum, and a ventilation part of the EUV pellicle preferably has an area as large as possible.

Therefore, a hole is preferably provided on a side face of the pellicle frame, and the size of a jig hole or vent hole is 0.5 to 1.0 mm in length (diameter in a case of a circle) in a thickness direction of the frame. The shape of the hole is not limited, and may be a circle or a rectangle. In addition, usually, the jig hole is a hole that does not penetrate from an outer side face to an inner side face, and the vent hole is a hole that penetrates from an outer side face to an inner side face.

In a case where a hole is provided on a side face of a pellicle frame, a margin of at least 0.2 mm is required around the processed hole in order to keep the restrictions on processing and the strength of the frame. If a jig hole or vent hole having a length size of 1.0 mm or more in a thickness direction of the frame is provided, the thickness of the frame is preferably 1.4 mm or more.

In general, as to the size of a pellicle frame for EUV, the outer length of the long side is 145 to 152 mm, the outer length of the short side is 113 to 120 mm, the thickness is 1.0 to 2.0 mm, and the width is 3.0 to 4.0 mm. Further, the volume of the pellicle frame is preferably 3.2 cm$^3$ or less, and more preferably 2.6 cm$^3$ or less.

In the present invention, as the material for a pellicle frame, a metal or alloy having a linear expansion coefficient of $10 \times 10^{-6}$ (1/K) or less and further a density of 5 g/cm$^3$ or less is used.

In the present invention, by using a metal or an alloy as the material for a pellicle frame, a hole can be provided on a side face even with a margin of 0.2 mm. For example, a hole having a diameter of 1.0 mm can be provided on a side face of a pellicle frame having a thickness of 1.5 mm. At this time, the margin on each of the above and below of the hole is 0.25 mm.

In addition, in a case of forming a hole in a pellicle frame made of a brittle material such as a silicon single crystal, a margin of at least 0.5 mm is required around the hole. Therefore, on a side face of a pellicle frame having a thickness of 1.5 mm, only a hole having a diameter of up to 0.5 mm can be formed. In this case, there is a fear that the size of a ventilation part as an EUV pellicle becomes insufficient, and further in order to reliably hold or peel off with a jig hole having a diameter of 0.5 mm, it is required to increase the number of holes, and the yield is also lowered. Moreover, even if the margin is 0.5 mm, there is a high possibility of breakage when a large force is applied as during peeling.

In the present invention, the material for a pellicle frame has a linear expansion coefficient of $10 \times 10^{-6}$ (1/K) or less, and if the linear expansion coefficient is within this range, expansion and contraction, and distortion of the pellicle frame, which can be caused by a temperature rise due to the light energy at the time of exposure, can be suppressed sufficiently to be smaller, so that the generation of wrinkles or breakage on a pellicle film can be prevented.

In addition, in the present invention, the density of a metal or alloy that is a material for a pellicle frame is 4.6 g/cm$^3$ or less. If the density is within this range, the weight can be reduced to 15 g or less in a pellicle frame having a volume of 3.2 cm$^3$ or less. However, in a case where the volume of a pellicle frame exceeds 2.6 cm$^3$, it is required to reduce the weight of the pellicle film or mask pressure-sensitive adhesive other than the pellicle frame to 3 g or less. Therefore, the volume of a pellicle frame is preferably 2.6 cm$^3$ or less, and the density is also more preferably 4.5 g/cm$^3$ or less.

As such a metal or alloy, titanium, or a titanium alloy such as a Ti—V—Al alloy, and a Ti—V—Cr—Sn—Al alloy can be mentioned, and can be preferably used.

In the pellicle according to the present invention, a pellicle film is arranged on an upper end face of the above pellicle frame with a pressure-sensitive adhesive or an adhesive agent therebetween. The material for the pressure-sensitive adhesive or the adhesive agent is not limited, and a known material can be used. For example, a good solvent for a pellicle film is applied, and then may be air dried and bonded, or an adhesive agent or pressure-sensitive adhesive of an acrylic resin, a silicone resin, an epoxy resin or the like may be used.

In addition, there is no restriction on the material for a pellicle film, and as the material, a material having a high transmittance at a wavelength of an exposure light source and a high light resistance is preferred. For example, for an excimer laser, an amorphous fluoropolymer or the like may be used. Examples of the amorphous fluoropolymer include CYTOP [trade name, manufactured by ASAHI GLASS CO., LTD.], and Teflon (registered trademark) AF [trade name, manufactured by E. I. du Pont de Nemours and Company].

In addition, an ultrathin silicon film that is constituted of a monocrystalline silicon, a polycrystalline silicon, or an amorphous silicon, or a carbon film is used for EUV exposure. The pellicle film may be provided with a protective film of SiC, $SiO_2$, $Si_3N_4$, SiON, $Y_2O_3$, YN, Mo, Ru, Rh or the like.

Further, on a lower end face of a pellicle frame, a pressure-sensitive adhesive for the attachment onto a photomask is formed. As the mask pressure-sensitive adhesive, a known mask pressure-sensitive adhesive can be used, and a pressure-sensitive adhesive made of a polybutene resin, a polyvinyl acetate resin, a poly(styrene-ethylene-butadiene-styrene) (SEBS) resin, an acrylic resin, a silicone resin or the like can be used. In particular, a pressure-sensitive adhesive made of an acrylic resin, or a silicone resin is preferred.

The application of a pellicle film adhesive agent and a mask pressure-sensitive adhesive can be performed by using a coating applicator or the like, for example, by dipping, spraying, brushing, or a dispenser, and the application using a coating applicator by a dispenser is preferred from the viewpoint of the stability, the workability, the yield, or the like.

In addition, the pressure-sensitive adhesive or the adhesive agent is generally formed so as to have a width equal to or smaller than the width of a pellicle frame over the entire circumferential direction of an end face of the pellicle frame.

Further, in a case where the viscosity of each of a pellicle film adhesive agent and a mask pressure-sensitive adhesive is high and the application using a coating applicator is difficult, into the pellicle film adhesive agent and the mask pressure-sensitive adhesive, an aromatic solvent such as toluene, and xylene; an aliphatic solvent such as hexane, octane, isooctane, and isoparaffin; a ketone-based solvent such as methyl ethyl ketone, and methyl isobutyl ketone; an ester-based solvent such as ethyl acetate, and butyl acetate; an ether-based solvent such as diisopropyl ether, and 1,4-dioxane; or a mixed solvent thereof may be added as needed.

Onto a lower end face of a mask pressure-sensitive adhesive, a release layer (separator) for protecting the pressure-sensitive adhesive may be attached. There is no particular restriction on the material for the release layer, and for example, polyethylene terephthalate (PET), polytetrafluoroethylene (PTFE), tetrafluoroethylene-perfluoroalkyl vinyl ether copolymer (PFA), polyethylene (PE), polycarbonate (PC), polyvinyl chloride (PVC), polypropylene (PP), or the like can be used. Further, as needed, a release agent such as a silicone-based release agent or a fluorine-based release agent may be applied onto a surface of the release layer.

In a case where a hole penetrating from an outer side face to an inner side face is provided in a pellicle frame, a filter for dust removal may be arranged for the purpose of particle removal. The filter may be arranged inside the hole or may be arranged on a side face so as to cover the opening part of the hole.

In addition, in a pellicle frame for EUV, the total area of the opening parts of vent holes is preferably 5 $mm^2$ or more, and more preferably 10 $mm^2$ or more. For example, the vent hole may be penetrated from an outer side face toward an inner side face so as to form a recess on a lower end face of the pellicle frame.

Figure 1B:
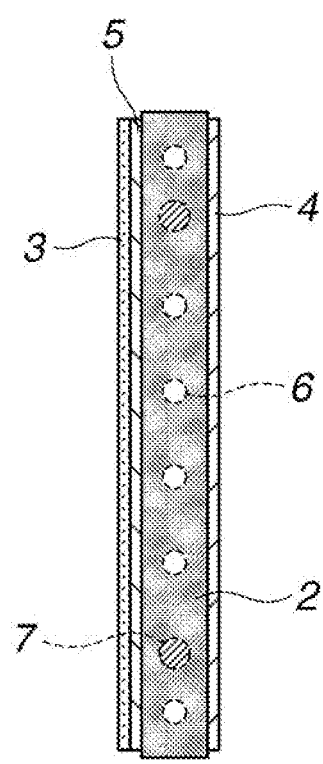
Figure 1C:
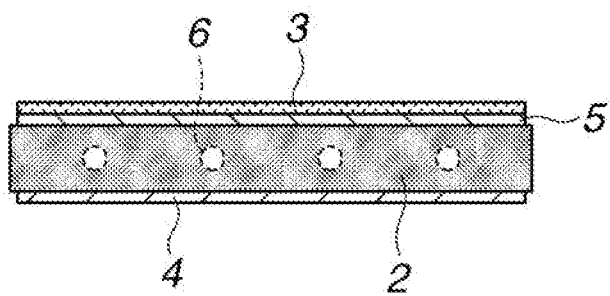
Figure 2A:
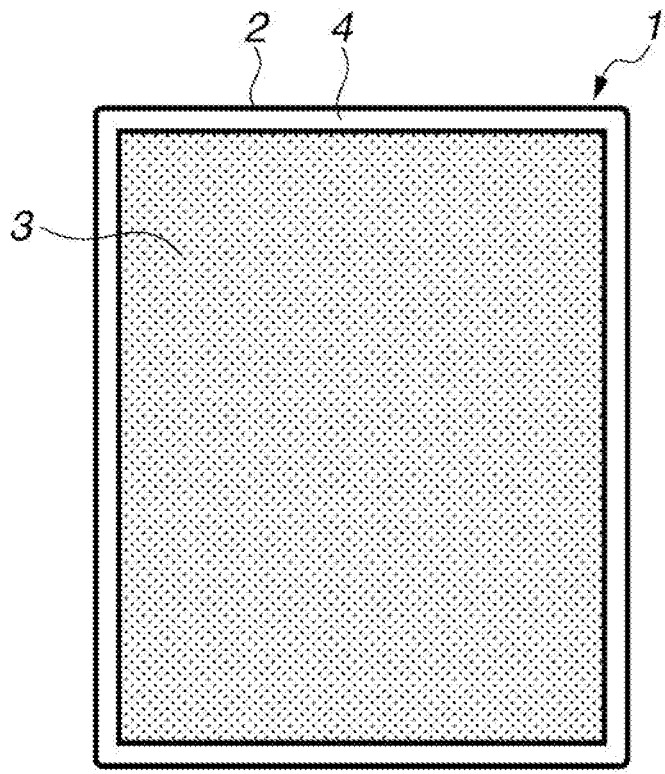
FIGS. 2A to 2C are schematic views showing another embodiment of the pellicle to frame according to the present invention.
Figure 2B:
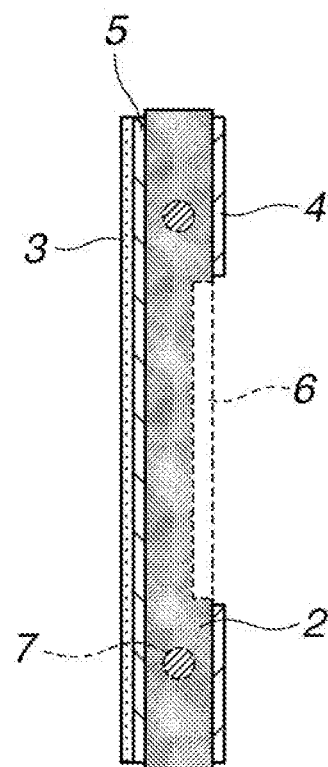
Figure 2C:
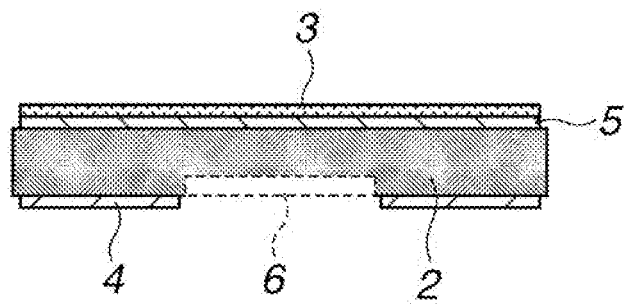

Herein, FIGS. 1A to 1C, and 2A to 2C show an example of a pellicle 1 including the pellicle frame 2 according to the present invention as an element. A pellicle film 3 is bonded and stretched onto an upper end face of the pellicle frame 2 by an adhesive agent 5. Further, on a lower end face of the pellicle frame 2, a pressure-sensitive adhesive 4 for the attachment onto a photomask (not shown) is provided. In addition, in the drawing, the reference sign 6 shows a vent hole, and in a pellicle frame in FIGS. 2A to 2C, a vent hole is formed so as to form a recess 6 on a lower end face of the pellicle frame unlike in the case of FIGS. 1A to 1C. In addition, usually, the reference sign 7 shows a jig hole formed for peeling off a pellicle from a photomask by using a jig.

EXAMPLES

Hereinafter, the present invention is specifically described with reference to Examples and Comparative Examples, however, the present invention is not limited to the following Examples.

Example 1

A pellicle frame (with an outer size of 150 mm×118 mm×1.5 mm, and a frame width of 3.0 mm) made of titanium (having a linear expansion coefficient of $8.4 \times 10^{-6}$ (1/K), and a density of 4.5 $g/cm^3$) was prepared.

On an outer side face of the long side of the pellicle frame, two jig holes each having a diameter of 1 mm and a depth of 1.2 mm were provided at two places each with a distance of 52 mm away from the center of the side in the corner direction. In addition, six through holes were provided at six places with a distance of 10 mm, 30 mm, and 65 mm, respectively away from the center of the long side in the corner direction, and four through holes were provided at four places with a distance of 10 mm, and 30 mm, respectively away from the center of the short side in the corner direction.

This pellicle frame was washed with a neutral detergent and pure water, and dried, and then a silicone pressure-sensitive adhesive (X-40-3264 manufactured by Shin-Etsu Chemical Co., Ltd.) was applied over the entire circumference of the upper and lower end faces of the frame.

After that, the pellicle frame was heated at 90° C. for 12 hours to cure the pressure-sensitive adhesive on the upper and lower end faces. Subsequently, an ultrathin silicon film as a pellicle film was press bonded to the pressure-sensitive adhesive formed on the upper end face of the frame, and a pellicle was completed.

Herein, the volume of the pellicle frame was around 2.4 $cm^3$, and the total weight of the pellicle film and the pressure-sensitive adhesive was around 3.1 g.

Example 2

As the material for a pellicle frame, a Ti—Al6-V4 titanium alloy (having a linear expansion coefficient of $8.8 \times 10^{-6}$ (1/K), and a density of 4.4 $g/cm^3$), which is an alloy of titanium, aluminum and vanadium, was used. Except for the above-described material for a pellicle frame, a pellicle was prepared in a similar manner as in Example 1.

Comparative Example 1

As the material for a pellicle frame, a quartz glass ($SiO_2$) (having a linear expansion coefficient of $0.5 \times 10^{-6}$ (1/K), and a density of 2.2 $g/cm^3$) was used. Except for the above-described material for a pellicle frame, a pellicle was prepared in a similar manner as in Example 1.

In this case, when jig holes or through holes were provided in the pellicle frame, 7 out of 10 were broken. Further, when a pellicle was tried to be peeled off from the quartz substrate by using a peeling jig after the heat cycle test described later, the jig hole was broken.

Comparative Example 2

As the material for a pellicle frame, a silicon nitride ($Si_3N_4$) (having a linear expansion coefficient of $2.8 \times 10^{-6}$ (1/K), and a density of 3.2 $g/cm^3$) was used. Except for the above-described material for a pellicle frame, a pellicle was prepared in a similar manner as in Example 1.

In this case, when jig holes or through holes were provided in the pellicle frame, 9 out of 10 were broken. Further, when a pellicle was tried to be peeled off from the quartz substrate by using a peeling jig after the heat cycle test described later, the jig hole was broken.

Comparative Example 3

As the material for a pellicle frame, invar (Fe—Ni36) (having a linear expansion coefficient of $1.5 \times 10^{-6}$ (1/K), and a density of 8.1 g/cm$^3$) was used. Except for the above-described material for a pellicle frame, a pellicle was prepared in a similar manner as in Example 1.

Comparative Example 4

As the material for a pellicle frame, aluminum (Al) (having a linear expansion coefficient of 23×10$^{-6}$ (1/K), and a density of 2.7 g/cm$^3$) was used. Except for the above-described material for a pellicle frame, a pellicle was prepared in a similar manner as in Example 1.

The pellicles prepared in Examples 1 and 2 and Comparative Examples 1 to 4 were subjected to a heat cycle test shown below. In Table 1, the processability of each material as a pellicle frame, the results of a heat cycle test, the pellicle weight, and the overall evaluation results of each pellicle are shown.

[Heat Cycle Test]

A cycle in which a pellicle attached onto a quartz substrate was heated at 200° C. in an oven and left to stand for 24 hours, and then was left to stand further for 24 hours at room temperature was repeated five times. After that, the state of the pellicle was visually confirmed.

TABLE 1

| | Material | Linear expansion coefficient [1/K] | Density [g/cm$^3$] | Processability | Heat cycle test | Pellicle weight [g] | Overall evaluation |
|---|---|---|---|---|---|---|---|
| Example 1 | Ti | 8.4 × 10$^{-6}$ | 4.5 | Favorable (no breakage) | Favorable | 13.9 | ○ |
| Example 2 | Ti—Al—V | 8.8 × 10$^{-6}$ | 4.4 | Favorable (no breakage) | Favorable | 13.7 | ○ |
| Comparative Example 1 | SiO$_2$ | 0.5 × 10$^{-6}$ | 2.2 | 7 out of 10 were broken | Favorable | 8.4 | X |
| Comparative Example 2 | Si$_3$N$_4$ | 2.8 × 10$^{-6}$ | 3.2 | 9 out of 10 were broken | Favorable | 10.8 | X |
| Comparative Example 3 | Fe—Ni | 1.5 × 10$^{-6}$ | 8.1 | Favorable (no breakage) | Favorable | 22.5 | X |
| Comparative Example 4 | Al | 23 × 10$^{-6}$ | 2.7 | Favorable (no breakage) | Poor (pellicle film was broken) | 9.6 | X |

According to the results in Table 1, the pellicles of Examples 1 and 2 had favorable heat cycle test results and also had favorable processability, and the pellicle weight was also able to be suppressed to 15 g or less.

On the other hand, the pellicles of Comparative Examples 1 and 2 had a problem in the processability, and had difficulty of forming a hole in a side face part.

The pellicle of Comparative Example 3 had favorable heat cycle test results and also had favorable processability, however, the pellicle weight exceeded 15 g, therefore, the pellicle cannot be applied to EUV lithography.

The pellicle frame of Comparative Example 4 had large expansion and contraction of a frame for a pellicle by a heat cycle test, and the pellicle film was broken.

Japanese Patent Application No. 2017-197004 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pellicle frame having a weight of 15 g or less.

2. The pellicle frame of claim 1, wherein the pellicle frame has a thickness of less than 2.5 mm and comprises a metal or alloy.

3. The pellicle frame of claim 1, wherein the pellicle frame has a width of from 3.0 to 4.0 mm.

4. The pellicle frame of claim 2, wherein the pellicle frame has a width of from 3.0 to 4.0 mm.

5. The pellicle frame of claim 1, wherein the outer length of the long side is from 145 to 152 mm, the outer length of the short side is from 113 to 120 mm, the thickness is from 1.0 to 2.0 mm, and the width is from 3.0 to 4.0 mm.

6. The pellicle frame of claim 1, wherein the volume of the pellicle frame is 3.2 cm$^3$ or less.

7. The pellicle frame of claim 1, wherein the density of the pellicle frame is 4.6 g/cm$^3$ or less.

8. The pellicle frame of claim 1, wherein the volume of the pellicle frame is 2.6 cm$^3$ or less and the density of the pellicle frame is 4.5 g/cm$^3$ or less.

9. The pellicle frame of claim 1, wherein one or a plurality of holes is provided on a side face.

10. The pellicle frame of claim 9, wherein the size of the holes is 0.5 to 1.0 mm in length in a thickness direction of the frame.

11. The pellicle frame of claim 1, wherein vent holes are formed and the total area of the opening parts of the vent holes is 5 mm$^2$ or more.

12. A pellicle, comprising:
the pellicle frame of claim 1 as an element.

13. The pellicle of claim 12, wherein the total weight of the pellicle is 15 g or less.

14. The pellicle of claim 12, wherein the pellicle further comprises a pellicle film and a mask pressure-sensitive adhesive and the volume of the pellicle frame exceeds 2.6 mm$^3$ and is 3.2 mm$^3$ or less, and the weight of the pellicle film and the mask pressure-sensitive adhesive is 3 g or less.

15. A photomask attaching a pellicle, wherein the pellicle of claim 12 is attached onto a surface of a photomask.

16. An exposure method, wherein the exposure is performed by using the photomask attaching a pellicle of claim 15.

17. A manufacturing method of a semiconductor device, comprising a step of forming a pattern by irradiating a semiconductor wafer with light wherein the photomask attaching a pellicle of claim 15 is used.

18. A manufacturing method of a liquid crystal display, comprising a step of forming a pattern by irradiating an original plate for liquid crystal with light wherein the photomask attaching a pellicle of claim 15 is used.

* * * * *